United States Patent [19]

Quadri

[11] 4,179,750
[45] Dec. 18, 1979

[54] MAGNETIC BUBBLE TYPE D/A CONVERTER

[75] Inventor: Farooq M. Quadri, San Diego, Calif.

[73] Assignee: Burroughs Corporation, Detroit, Mich.

[21] Appl. No.: 895,991

[22] Filed: Apr. 13, 1978

[51] Int. Cl.² .............................................. G11C 19/08
[52] U.S. Cl. ......................................... 365/8; 365/15; 340/347 DA
[58] Field of Search ..................... 365/4, 8, 12, 14, 15; 340/347 DA

[56] References Cited

U.S. PATENT DOCUMENTS

| | | | |
|---|---|---|---|
| 3,803,591 | 4/1974 | Watanabe et al. | 365/4 |
| 4,027,283 | 5/1977 | Tang | 365/15 |

*Primary Examiner*—James W. Moffitt
*Attorney, Agent, or Firm*—Joseph R. Dwyer; Mervyn L. Young; Kevin R. Peterson

[57] ABSTRACT

A digital-to-analog converter utilizing magnetic domains with particular application to addressing large capacity bubble memory modules economically and with as short a delay as one cycle of rotation of the magnetic in-plane field including a plurality of storage loops and magnetoresistive sensors arranged in bridge networks to produce signals whose amplitude denote a weighted binary digit.

11 Claims, 6 Drawing Figures

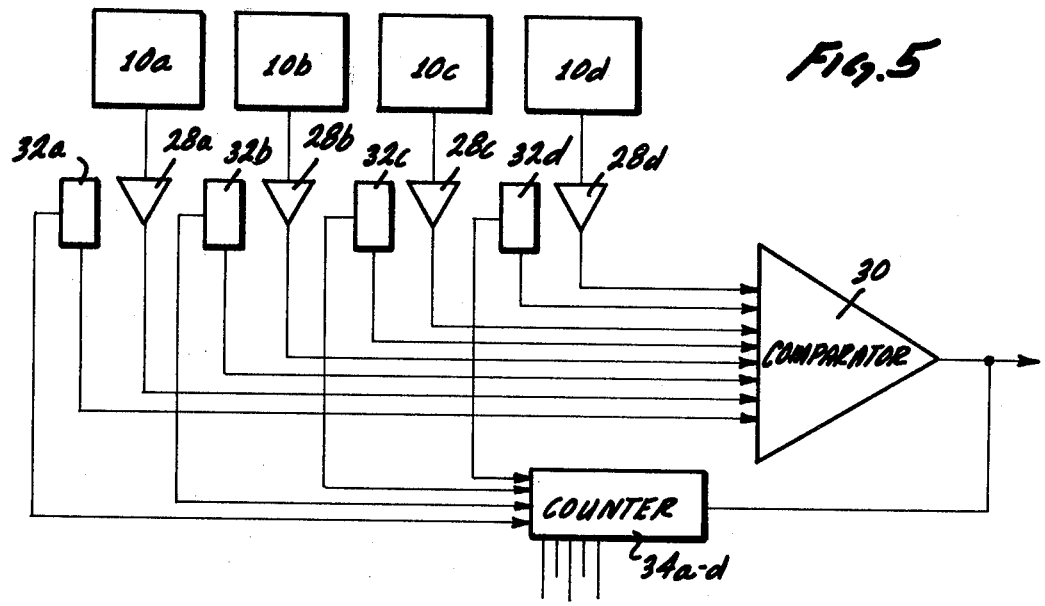
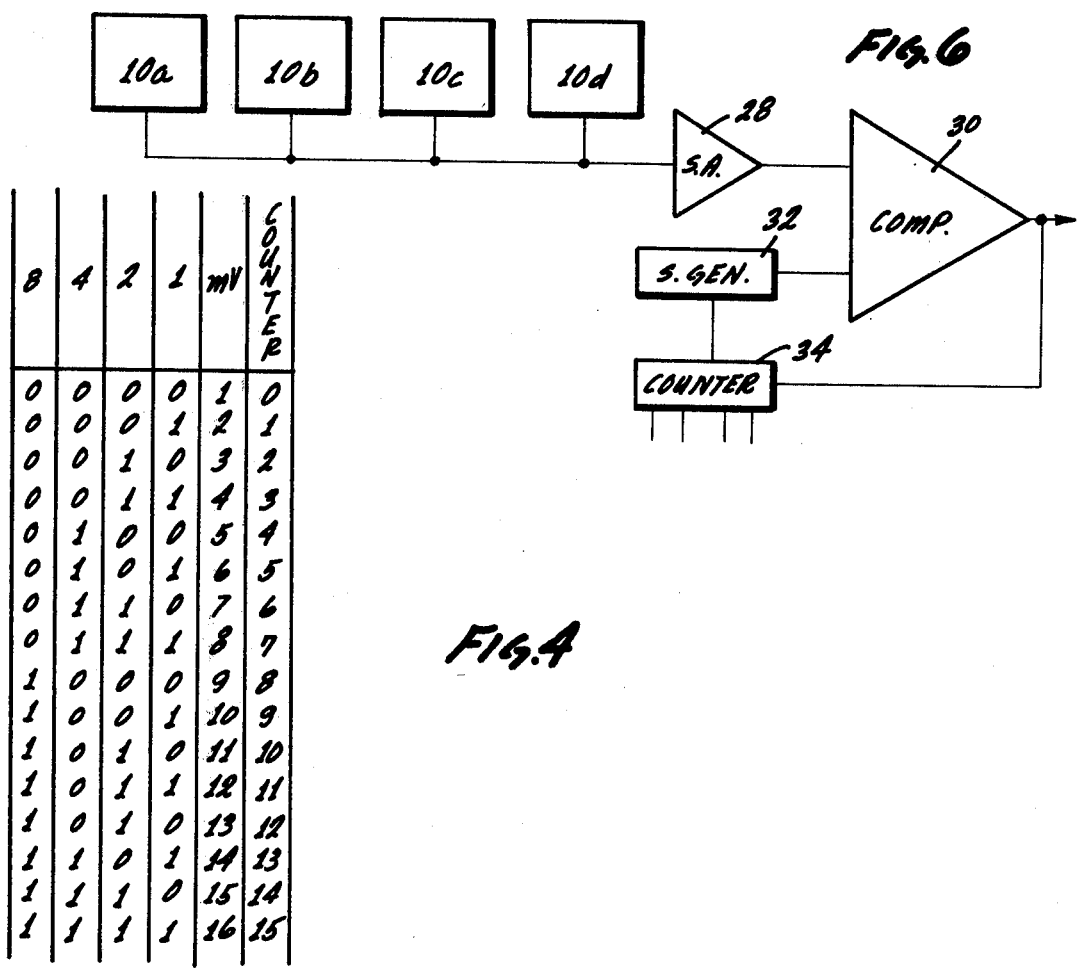

MAGNETIC BUBBLE TYPE D/A CONVERTER

BACKGROUND OF THE INVENTION

1. Field of the Invention

This invention relates to magnetic bubble domain modules and, more particularly, this invention relates to digital-to-analog conversion utilizing magnetic bubble storage memory techniques particularly adaptable for addressing large capacity bubble memories.

2. Prior Art

Conventionally, a bubble memory module utilizes bubble storage means formed of a selected type of propagate elements arranged in loops with transfer-in and transfer-out gates or ports located adjacent to each loop for transferring bubbles in or out of the loops. These loops, called storage loops, have bubbles continuously circulating therein in response to an in-plane rotating magnetic field, and are either transferred out of the storage loops, or replicated, and the bubble, or the replicated portion, is propagated by the in-plane rotating field through a magnetoresistive sensor, which relies on a change of resistance of magnetoresistive material, such as Permalloy, to detect the presence or absence of a bubble propagated thereunder and to generate a signal which is sensed by a read-out device. Such detectors are conventionally arranged in a bridge network in which one leg thereof comprises an active detector and another leg thereof comprises a dummy detector; the former being the detector under which bubbles are propagated and the other detector, while subject to the same in-plane rotating propagating field, is out of the bubble path and balances the system against noise. Typical examples of bridge networks utilizing magnetoresistive detector devices are shown in the U.S. Pat. No. 3,833,858 to Leinhard, et al. and in the U.S. Pat. No. 3,953,840 to Cutler, et al.

Also in the prior art are a number of patents involving bubble memory organizations having addressing schemes directed to improving access time to the data stored in the storage loops. Typical examples in the field of decoders are the U.S. Pat. Nos. 3,911,411 to George, 3,757,314 to Homma, et al., 3,760,386 to Quadri and 3,858,188 to Keefe. There are also patents in the field of bubble memory organizations directed to analog-to-digital conversion, such as the U.S. Pat. No. 3,803,591 to Watanable, et. al., and in the field of thin films (but not bubble memories) U.S. Pat. Nos. 3,372,387 to Tolman and 3,334,343 to Snyder show digital-to-analog conversion.

However, lacking in the prior art is the utilization of bubble memory techniques including the bridge type magnetoresistive sensors to form a digital-to-analog converter which also facilitates economical accessing of digital information in a short period of time.

Thus, it is a primary object of this invention to provide a digital-to-analog converter utilizing a magnetic bubble memory techniques.

A second object of this invention is to provide a digital-to-analog conversion technique in addressing or reading large capacity storage modules in a relatively short period of time which would be as short as one cycle of the propagating in-plane magnetic field.

A third object of the invention is to provide a means for obtaining binary weighted output utilizing magnetic bubble memory techniques and magnetoresistive sensors formed in a bridge network.

A fourth object of the present invention is to provide a bubble memory type converter utilizing magnetic memory type storage loops and bridge type magnetoresistive sensors, all producible on a single chip utilizing conventional masking techniques.

SUMMARY OF THE INVENTION

According to the present invention, the magnetic domain digital-to-analog converter module comprises a plurality of storage loops formed of propagate elements in which domains circulate continuously in response to an in-plane magnetic field and conventional means for replicating and/or transferring out domains and for propagating said domains to sensor means. The sensor means comprise bridge network of sensors, one bridge of each storage loop, formed of magnetoresistive elements by which the presence or absence of bubbles propagated thereunder are detected and the signal generated thereby is sensed by a read-out means. By the position of each storage loop, each storage loop represents a weighted binary digit and by arranging the legs of the bridge network so as to form current dividers, pulses of different amplitudes are generated by the bubbles propagated from each storage loop. The read-out means connected to the sensors comprise a sense amplifier, a staircase signal generator, and counter which together with a comparator compares the amplitude of the voltage from the staircase generator with the amplitude of the signal from the sensors and when a match occurs identifies the binary bit position of the signal generated from each storage loop. In the embodiment disclosed, four storage loops representing $2^4$ bit positions can be determined in one cycle of the in-plane rotating magnetic field. With four similar devices connected to one comparator, $2^{16}$ bit addresses can be determined in four cycles or alternatively with the same number of devices and four comparators such an address can be read in only one cycle.

BRIEF DESCRIPTION OF THE DRAWINGS

FIG. 4 is a table showing the D/A output of FIG. 1, FIG. 5 shows a plurality of memory modules and their associated components for a digital-to-analog conversion connected in parallel for a $2^{16}$ output signal in one rotation of the in-plane magnetic field, and FIG. 6 shows a plurality of domain modules connected in series for a $2^{16}$ output in four rotations of the in-plane magnetic field.

DESCRIPTION OF THE PREFERRED EMBODIMENT

Figure 1:
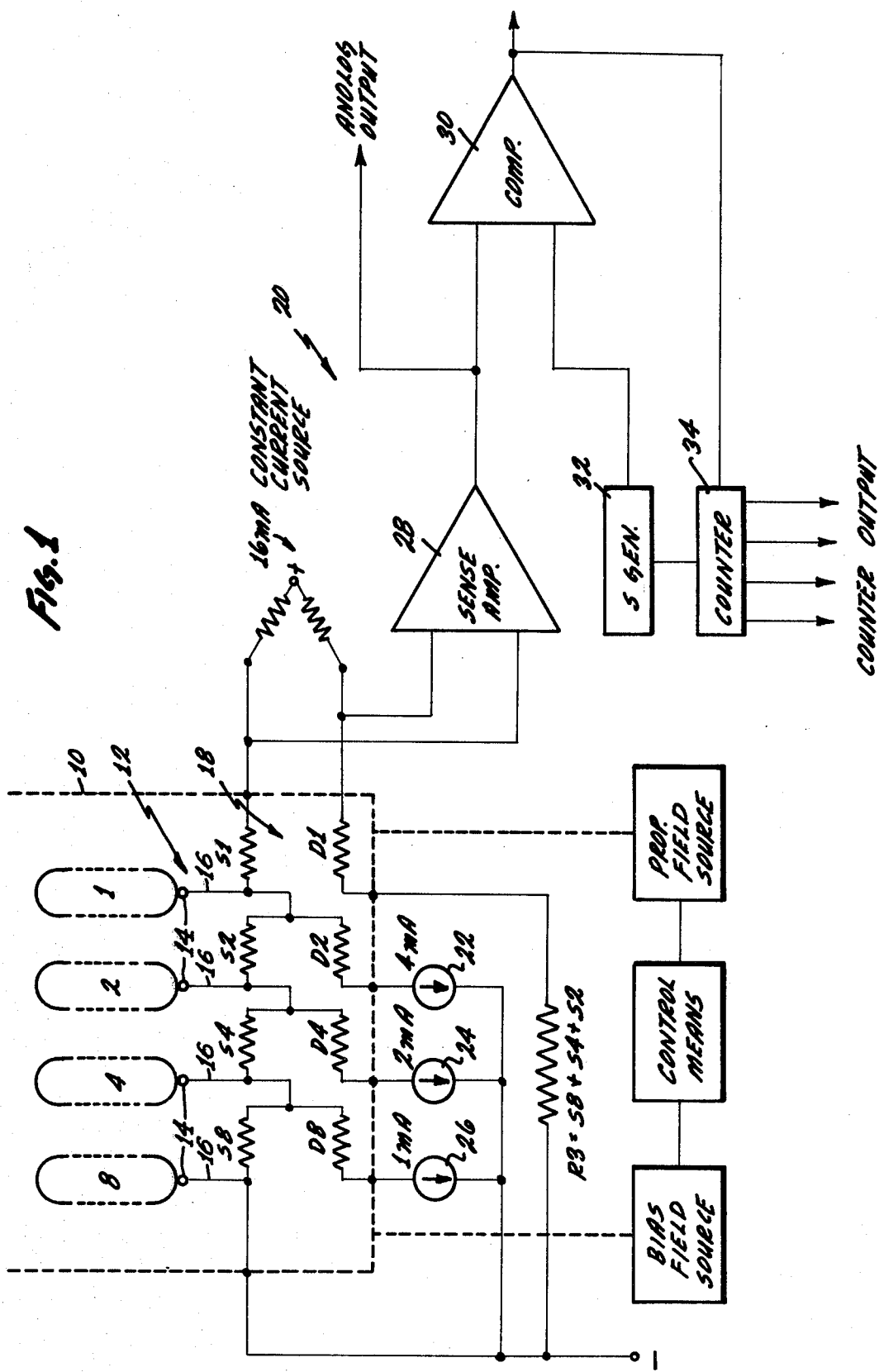
FIG. 1 is a schematic illustration of a digital-to-analog converter constructed in accordance with the teachings of this invention showing the bubble storage loops connected to sensor means both of which are formed on a bubble module together with associated components.
Figure 2:
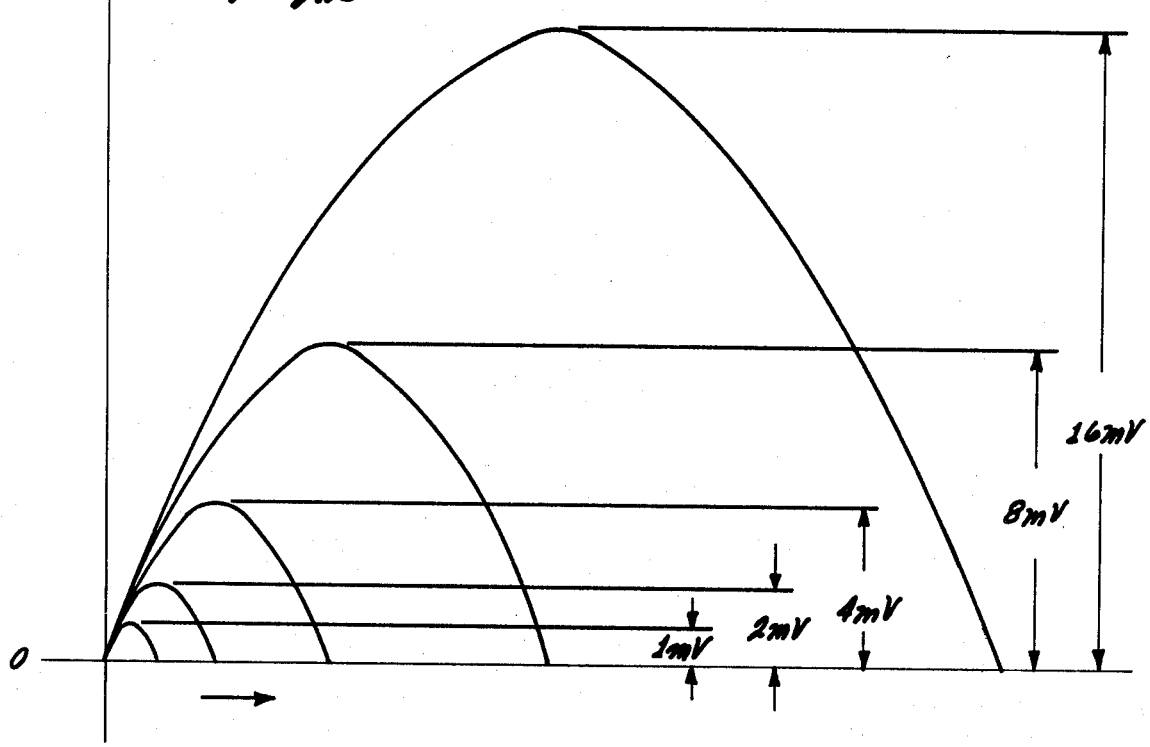
FIG. 2 is an idealized output signal from a sense amplifier shown as part of the associated components in FIG. 1.
Figure 3:
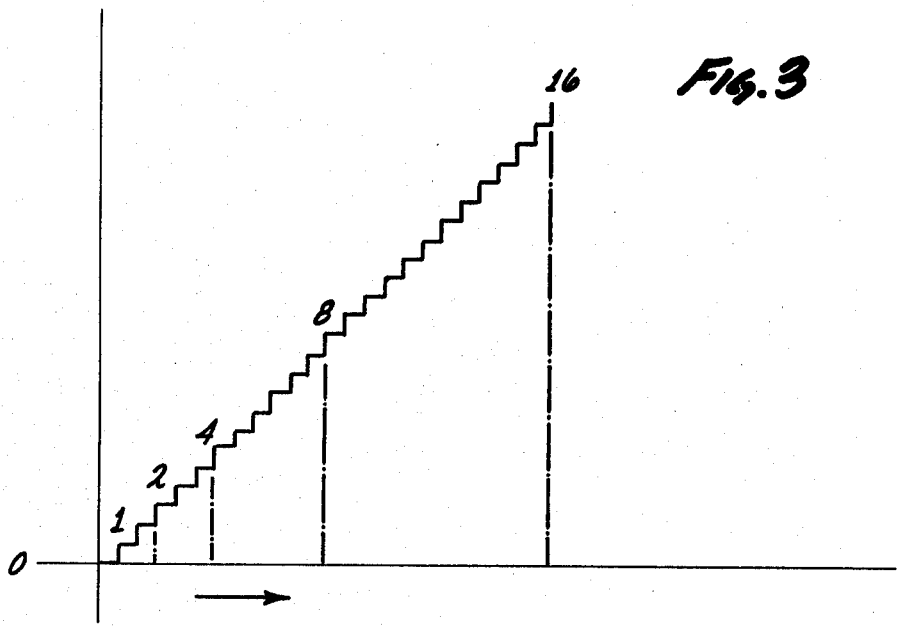
FIG. 3 is a idealized output from the staircase generator of FIG. 1 and showing its relationship to the idealized output of sense amplifier as illustrated in FIG. 2.

Referring now to the drawings, it can be seen that there is disclosed a bubble memory type module 10 embodying the digital-to-analog converter 12 of this invention. The bubble memory type module is formed so that conditions exist for establishing single wall domains on suitable magnetic material, such as epitaxial magnetic garnet film, formed on a non-magnetic garnet substrate; all of which are well known in the art. Typically, patterns of magnetically soft overlay material, forming propagate elements, are utilized to form idential storage loops, four are shown and identified as 8, 4, 2 and 1. (The reference numeral designation of the storage loops imply the weighted binary digit for the D/A conversion in this invention.) Each loop closes on itself so that bubbles, established in a loop, circulate indefinitely in response to a rotating in-plane magnetic field unless transferred out as for writing different information therein. A suitable write-in means is provided which usually comprises a generator and in-put track and a transfer-in gate, one gate for each storage loop, and a read-out means is also provided which usually comprises an output track, a replicator which can be part of the transfer-out gate for transferring bubbles, or replicated parts of bubbles, onto the output track. In the embodiment shown, the combined replicator/transfer-out gate 14 is shown connected to the output track 16. The generator, input track and transfer-out gate are not shown for simplification of the description of this invention.

The output track 16 is connected to sensor means, which is indicated in its entirety as 18, and which is connected to a readout means also designated in its entirety as 20; both the sensor means 18 and the readout means 20, sometimes called a signal processing means, will be described more in detail hereinafter since they form an important aspect of the invention. Suitable bias sources, control circuits, including auxillary circuits, such as pulsing circuits for the application of pulses to the generator, the transfer gates, etc., are utilized but since these sources and circuits are well known they are shown only herein as block diagrams.

Typically, in the operation of a bubble memory type module, bubbles are generated by a generator in a stream of bits where a bubble represents a binary "1" and the absence of a bubble (a void) represents a binary "0" in the bit stream and are propagated serially along an input track for transfer into the storage loops in parallel. Each storage loop has one propagate element for each bubble, or void, and thus each propagate element represents one bit position and, in this embodiment, the location of the loop, containing such a bit position, determines its weight in the binary number.

Thus, when it is desired to read the bit circulating in a storage loop such bits are transferred out either by the transfer-out gate or by a combined replicate/transfer-out gate such as 14. The use of the replicator, of course, allows a portion of the replicated bit to remain in its respective position in the storage loop, and in this way information in the loops is not destroyed. Thereafter, by successive in-plane field pulses while on the output track 16, the bits are propagated serially along the output track 16 to the sensor means 18 which translates the bits into electrical signals representing binary "1" or binary "0" which are read by the read-out means 20.

Typically, a sensor is arranged in a bridge network so that there is an active sensor (one leg of the bridge) such as S1, and a dummy sensor (a second leg of the bridge) such as D1, formed of propagate elements, conventionally of the chevron type; the active sensor being in the bubble flow path while the dummy sensor is utilized to balance the resistance of the active sensor and to balance against noise due to the rotating magnetic field acting on the propagate elements in the sensor.

Turning now more specifically to the sensor means 18 and the readout means 20 which, together with the storage loops and the position of the loop relative to one another, form an important aspect of this invention. As can be seen, the sensor means 18 comprises a cascade of sensors S8-D8, S4-D4, S2-D2, and S1-D1. The designation S and D represent the active and dummy sensors, respectively, and the number designation represent the storage loop to which the respective sensors are connected. Thus, a bridge network is formed of magnetoresistive devices such that all active sensors are connected in series between a positive current source and a negative current source and each are connected to their respective loops; the current source supplies a regulated current to these sensors. On the other hand, in order to form current dividers, both the active and dummy detectors are connected so that dummy detector D1 is connected directly to the negative current source through a balancing resistor R-3 and dummy detectors, D2, D4 and D8 are each connected on one end in common to the active detector of the preceding loop, viz, D2 to S1, D4 to S2 and D8 to S4 and to their respective active detector. The other end of each dummy detector D2, D4 and D8 is connected, respectively, to high impedance current sinks, 22, 24 and 26 which in turn are connected to the negative current source. These current sinks control the current flow therethrough to divide the current in steps entering the active detectors S2-S8. In the embodiment shown, current sink 22 draws 4 milliamps, current sink 24 draws 2 milliamps and current sink 21 draws 1 milliamp. With such arrangement of active detectors, bubbles propagating thereunder will produce an output signal according to the current flowing through the respective active detector. The representation of the amplitude of the signals generated is represented idealized in FIG. 4 but for the purposes of simplicity only the signals generated by the binary representation of a decimal 0, 1, 3, 9 and 15 are shown, although reference can be made to the binary table of FIG. 6 for the actual voltages which will be produced for the 15 weighted binary signals.

The voltage from the bridge sensor means 18 is connected to the signal processor 20 which impresses a sense amplifier 28 and its output is connected to the input of a comparator 30. A staircase generator 32 is connected to the input of the comparator and to a counter 34, the latter also being connected to the output of the comparator. With this arrangement, when there is a match in voltage between the output on the sense amplifier 28 and the output of the staircase generator 32, a signal is sent to the counter 34 which generates the binary output representing the analog output of the output of the sensors.

Thus, in the embodiment illustrated the output of four storage loops utilizing bubble memory techniques are converted into a binary address. In the embodiment illustrated, each loop would contain 16 propagate elements representing binary bits. To expand this concept, attention is directed to both FIGS. 5 and 6 which show arrangements of modules corresponding to the module 10 of FIG. 1, namely module 10a, 10b, 10c and 10d connected in parallel as in FIG. 5 or in series as in FIG. 6. In FIG. 5 the addresses of the four chips can be read in one propagate cycle or, depending upon the needs of the user, four cycles will produce the output of the four bubble memory chips in a serial arrangement of FIG. 6.

It is to be noted that in the embodiment illustrated, those elements or components which serve the same function in FIGS. 5 and 6 as they do in FIG. 1 are given the same reference numeral sometimes with a suffix a–d to denote the module with which they are specifically associated.

Finally, it should be noted, again with reference to FIG. 1, that the active and dummy sensors of each of the bridge networks are formed on the bubble memory chip which means that the resistances of the legs of the bridges can be closely controlled and while the current sinks and the matching resistance are shown outside the bubble memory chip, these too, could be made a part of the chip, if desired. Also, as shown in FIG. 1 the output of the sense amplifier and comparator can be used to send analog signals to another analog or digital device, if desired.

What is claimed is:

1. A digital-to-analog magnetic domain converter comprising:
   a domain propagation structure including magnetic elements disposed in an arrangement on which magnetic domains propagate in response to a rotating in-plane magnetic field,
   the arrangement including a predetermined number of storage loops positioned in a predetermined order and having a predetermined number of magnetic elements on which said domains circulate, said domains, or the absence of said domains, on said magnetic elements in said storage loops representing weighted binary bits due to the predetermined order position of said storage loops,
   means for transferring said weighted binary bits out of each of said storage loops in parallel as a weighted binary number, and
   means for receiving and sensing said transferred bits and converting same into electrical signals the magnitude of which depends upon their binary weight to represent a weighted binary number.

2. The converter as claimed in claim 1 wherein said means for transferring said bits out of said storage loops comprises means for forming replicas of said bits and wherein said replicas are transferred toward said receiving and sensing means.

3. The converter as claimed in claim 1 further including a comparator means for receiving the signals from said receiving and sensing means and for receiving signals from another source as input signals and for comparing said input signals with said signals from receiving and sensing means and generating a signal when said input signals have reached a desired criteria.

4. The converter as claimed in claim 1 wherein said means for receiving and sensing said transferred bits comprises a plurality of resistive elements electrically connected in a bridge network configuration, one network for each storage loop and each network having a different current level flowing therethrough, for detecting changes in electrical resistance in response to domains coming into proximity with said elements and further including means to sense the voltage level from said bridge network and sense a voltage level from another source and to generate a data output signal whenever the two voltage levels reach a predetermined level.

5. The converter as claimed in claim 4 wherein said other source is a staircase generator.

6. The converter as claimed in claim 1 wherein said means for receiving and sensing said transferred bits comprises a bridge network formed of magnetoresistive elements and arranged to form current dividers between current sources connected thereto so that each storage loop has an associated magnetoresistive element with a different current value flowing therethrough which will generate a signal of a different amplitude in response to a bit thereunder.

7. The converter as claimed in claim 1 wherein the means for receiving and sensing said transferred bits comprises a resistance bridge circuit comprising magnetoresistive elements connected in cooperating pairs to form legs of the bridge network, said magnetoresistive elements connected in series and in parallel and connected to means for sinking current of different amounts therethrough so that each of said magnetoresistive elements for each of said storage loops will generate a different voltage signal depending upon the presence or absence of said bits transferred from said storage loops.

8. A digital-to-analog magnetic domain converter comprising:
   a domain propagation structure in which domains exist and including magnetic elements disposed in an arrangement on which magnetic domains propagate in response to a rotating in-plane magnetic field,
   the arrangement including a predetermined number of storage loops positioned in a predetermined order and having a predetermined number of magnetic elements upon which said domains circulate, the presence or absence of said domains on said magnetic elements representing weighted binary bits due to the position of said storage loops,
   a plurality of sensing elements, each of which is responsive to the presence or absence of domains presented thereto from said storage loops and providing output signals indicative of domains in said sensing elements, said output signals whose magnitude is correlated to the position of said storage loops and providing a combined output signal, and
   signal processing means being responsive to the combined output signal for providing binary outputs depending upon the magnitude of said output signal in relation to a signal from a second source.

9. The converter as claimed in claim 8 wherein said sensing elements are magnetoresistive and associated with each storage loop, there being a different current value provided through said elements associated with each storage loop.

10. The converter as claimed in claim 9 wherein said signal processing means includes a comparater and wherein the signal from the second source is a staircase generator.

11. The converter as claimed in claim 8 wherein said sensing elements are magnetoresistive and the domains are sensed by said magnetoresistive sensing elements simultaneously, the magnitude of the electrical output from each magnetoresistive sensing element depending upon the current flowing through said magnetoresistive sensing elements.

* * * * *